(12) United States Patent
Habara et al.

(10) Patent No.: US 7,414,402 B2
(45) Date of Patent: Aug. 19, 2008

(54) COIL APPARATUS AND NUCLEAR MAGNETIC RESONANCE APPARATUS USING THE SAME

(75) Inventors: Hideta Habara, Musashino (JP); Hisaaki Ochi, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/729,776

(22) Filed: Mar. 30, 2007

(65) Prior Publication Data
US 2007/0229076 A1    Oct. 4, 2007

(30) Foreign Application Priority Data
Apr. 4, 2006    (JP) .............................. 2006-102870

(51) Int. Cl.
*G01V 3/00*    (2006.01)
(52) U.S. Cl. ...................................... 324/318; 324/322
(58) Field of Classification Search ......... 324/300–322; 600/407–455; 333/219
See application file for complete search history.

(56) References Cited

U.S. PATENT DOCUMENTS

| | | | | |
|---|---|---|---|---|
| 4,621,237 A | * | 11/1986 | Timms ........................ | 324/322 |
| 4,712,067 A | * | 12/1987 | Roschmann et al. ........ | 324/318 |
| 5,053,711 A | * | 10/1991 | Hayes et al. ................ | 324/318 |
| 5,477,146 A | * | 12/1995 | Jones ......................... | 324/318 |
| 5,557,247 A | | 9/1996 | Vaughn, Jr. | |
| 5,886,596 A | * | 3/1999 | Vaughn, Jr. ................. | 333/219 |
| 6,411,090 B1 | * | 6/2002 | Boskamp .................... | 324/318 |
| 6,590,393 B2 | * | 7/2003 | Vaughn et al. .............. | 324/318 |
| 7,180,291 B2 | * | 2/2007 | Chmielewski et al. ...... | 324/318 |
| 7,239,139 B2 | * | 7/2007 | Findeklee ................... | 324/318 |
| 7,253,622 B2 | * | 8/2007 | Saylor et al. ................ | 324/318 |
| 7,372,273 B2 | * | 5/2008 | Huang et al. ................ | 324/318 |
| 2004/0012391 A1 | | 1/2004 | Vaughan, Jr. et al. | |

OTHER PUBLICATIONS

Li, Y. et al. "A Head Coil Design Using a Single Coil Structure of Dual Operation Modes for Homogeneous Volume Excitation and Parallel Signal Acquisition in High Field Imaging", Proc. Intl. Soc. Mag. Reson. Med. 13 (2005) p. 954.

* cited by examiner

*Primary Examiner*—Brij B Shrivastav
(74) *Attorney, Agent, or Firm*—Reed Smith LLP; Stanley P. Fisher, Esq.; Juan Carlos A. Marquez, Esq.

(57) ABSTRACT

An RF coil apparatus suitable for a high magnetic field MRI apparatus includes a plurality of subcoils arranged substantially in a cylindrical form. Each subcoil includes a first conductor part and a second conductor part. The second conductor part is disposed on the inside of a cylinder, i.e., on the test subject side. This coil apparatus includes a conduction part for attaining conduction among the subcoils, and a conduction control part for controlling a conduction state between the first conductor part and the second conductor part, conducting connection to a transmission and reception part which conducts signal transmission and reception with a subcoil, and changing over electric capacitance of the subcoil according to whether to receive or transmit. Function changeover between the multi-channel mode and the one-channel mode is accomplished by conducting connection changeover and electric capacitance changeover.

20 Claims, 6 Drawing Sheets

ID BY REFERENCE

COIL APPARATUS AND NUCLEAR MAGNETIC RESONANCE APPARATUS USING THE SAME

INCORPORATION BY REFERENCE

The present application claims priority from Japanese application JP2006-102870 filed on Apr. 4, 2006, the content of which is hereby incorporated by reference into this application.

BACKGROUND OF THE INVENTION

The present invention relates to a coil apparatus for transmitting/receiving an electromagnetic wave, and a nuclear magnetic resonance imaging apparatus (hereafter referred to as "MRI apparatus") using the coil apparatus.

The MRI apparatus irradiates a subject disposed in a uniform static magnetic field generated by a magnet, with an electromagnetic field, excites nuclear spins in the subject, then receives a nuclear magnetic resonance signal which is an electromagnetic wave generated by nuclear spins, conducts imaging of the subject. The irradiation with the electromagnetic wave and reception of the nuclear magnetic resonance signal are conducted by an RF coil which transmits or receives an electromagnetic wave having a radio frequency (RE). Transmission coils, reception coils or coils serving as both transmission coils and reception coils having various shapes suitable for the MRI apparatus have been developed.

In recent years, the MRI apparatuses have had higher magnetic fields. As its merit, sensitivity improvement, consequent shortening of imaging time, and improvement of the imaging resolution are anticipated. On the other hand, a higher magnetic field in the MRI apparatus causes new problems such as uneven current distribution in the RF coil, a loss increase caused by higher resistance in the RF coil, uneven excitation region caused by RF absorption in the human body, and lowering in coil productivity caused by a limit of the self-resonant frequency in the RF coil.

In order to solve the problem of the productivity lowering of the RF coil among the above-described problems, new schemes of the RF coil such as the microstrip line type and the multiple patch resonator type have been proposed (see, for example, US 2004/001239A1, and U.S. Pat. No. 5,557,247). They are attracting attention as substitute techniques for the conventional schemes such as the ring coil array and the bird cage type coil in the high magnetic field MRI apparatus.

The problem of the RF absorption and reflection in the human body can be solved by sweeping the gradient magnetic field strength when irradiating with the excited RF and irradiating with an optimized RF. In this method, however, there is a problem that the irradiation time becomes longer. On the other hand, a technique of shortening the irradiation time by using a large number of RF coils has been developed. This technique is called parallel RF transmission. The parallel RF transmission is a method obtained by applying an imaging time shortening technique (called parallel imaging) using reception coils having different sensitivity regions to RF transmission. The parallel RF transmission has been proposed as a countermeasure to the problem of the uneven excitation region caused by RF absorption in the human body.

For conducting the parallel RF transmission, a plurality of transmission RF channels having different sensitivity regions are needed. In general, a coil of microstrip line type can have a configuration of multi-channel transmission/multi-channel reception. Therefore, the microstrip line coil is suitable for the parallel RF transmission scheme. For conducting the multi-channel reception, however, a multi-channel receiver is needed. It requires some cost to prepare the multi-channel receiver. On the other hand, the RF coil of the multiple patch resonator type mentioned above is a coil corresponding to one-channel transmission/one-channel reception or two-channel transmission/two-channel reception called quadrature. The coil of this type has a comparatively simple configuration, and the coil of this type can be easily mounted on an MRI apparatus having only one channel of transmission and reception system. However, the coil of this type cannot cope with the multi-channel transmission and the multi-channel reception.

As an RF coil suitable for the high magnetic field MRI apparatus, therefore, a coil that makes it possible to choose and switch the suitable number of channels at the time of each of transmission and reception according to the apparatus configuration is desired. If a microstrip line type coil is used and as many transmission reception changeover switches, phase shifters and branching filters as the number of channels are used, it is possible in principle to form a configuration of multi-channel transmission/one-channel reception or a configuration of one-channel transmission/multi-channel reception. When the number of channels increases, however, there is a demerit that the circuit adjustment and the work of balancing the compounding conducted among channels become complicated.

A coil apparatus that makes the one-channel transmission/multi-channel reception possible is disclosed in Proceedings of International Society of Magnetic Resonance in Medicine, vol. 13, p. 954, (2005). In this coil apparatus, a multiple patch resonator type coil is used as a one-channel coil at the time of transmission and used as a multi-channel loop coil array at the time of reception. Even if this technique is used, however, adaptation to the multi-channel transmission/one-channel reception is difficult. Furthermore, since the reception coil scheme is a loop coil array, coupling between adjacent coils increases, resulting in a demerit that the mounting becomes difficult and the configuration becomes complicated. Furthermore, in this method, nothing but a multi-channel configuration of N/2 channels can be implemented, where N is the number of conductors in a multiple patch resonator type coil called rung.

SUMMARY OF THE INVENTION

In view of the problems of the conventional art, an object of the present invention is to provide a coil apparatus that can be used for multi-channel transmission/one-channel reception or one-channel transmission/multi-channel reception.

Another object of the present invention is to provide a coil apparatus suitable for an MRI apparatus, especially for a high magnetic field MRI apparatus, and provide a coil apparatus that can cope with both the parallel imaging and parallel transmission.

A coil apparatus according to the present invention which attains the object is a coil apparatus used to transmit a signal to a test subject and/or receive a signal from the test subject, the coil apparatus including a plurality of subcoils each having a first conductor part and a second conductor part disposed nearer the test subject than the first conductor part, coil conduction means for attaining conduction among the subcoils, and first conduction control means for controlling a conduction state between the first conductor part and the second conductor part.

In the coil apparatus according to the present invention, the conduction state between the first conductor part and the second conductor part included in a subcoil is controlled by the first conduction control means so as to have electric capacitance at the time of transmission different from that at the time of reception. As a result, it become possible to implement a multi-channel mode in which each subcoil functions as a reception coil or a transmission coil and a one-channel mode in which the subcoils as a whole function as a reception coil or a transmission coil. Thus, the multi-channel transmission/one-channel reception or one-channel transmission/multi-channel reception can be implemented with one coil.

In the coil apparatus according to the present invention, the first conduction control means include, for example, at least one capacitor and switch means connected in parallel. The first conduction control means is made to have electric capacitance at time of transmission different from that at time of reception by changing over the switch means.

The coil apparatus according to the present invention can be combined with a measurement apparatus in which the number of the reception means or transmission means in transmission and reception means is less than the number of subcoils. For example, each of a plurality of subcoils is connected to transmission means, and only one subcoil is connected to reception means. Or each of the subcoils is connected to reception means, and only one subcoil is connected to transmission means. As a result, the multi-channel transmission/one-channel reception or the one-channel transmission/multi-channel reception can be implemented without increasing the number of the transmission coils or reception coils.

In the coil apparatus according to the present invention, the coil conduction means can include second conduction control means for controlling a conduction state between the subcoils. Owing to this configuration, it becomes possible to facilitate the circuit design of the first conduction control means and implementation of the one-channel transmission/multi-channel reception.

In a typical form of the coil apparatus according to the present invention, a plurality of subcoils substantially form a cylinder, and the subcoils are disposed so as to have the first conductor part on the outside of a cylinder and the second conductor part on the inside of the cylinder. The cylindrical form is suitable for a human head coil or a human whole body coil in the MRI apparatus.

In accordance with an aspect of the coil apparatus according to the present invention, subcoils disposed so as to be adjacent to each other have an electromagnetic wave transmission property between. As a result, it becomes possible to use the coil apparatus according to the present invention together with another transmission coil disposed on the outside of the coil apparatus according to the present invention.

In accordance with an aspect of the coil apparatus according to the present invention, the coil apparatus is formed of a nonmagnetic material. As a result, the coil apparatus becomes suitable for the MRI apparatus.

In addition, the present invention provides an MRI apparatus including the above-described coil apparatus. By including this coil apparatus, it is possible to implement parallel transmission utilizing the multi-channel transmission/one-channel reception and parallel imaging utilizing the one-channel transmission/multi-channel reception with a comparatively simple configuration.

According to the present invention, a microstrip line type coil and a multiple patch resonator type coil having a large degree of freedom in design when using a high magnetic field MRI apparatus, can be implemented by using one coil. Furthermore, since the coil has a form that allows intrusion of an external RF electromagnetic field when the coil is made to operate as a one-channel coil of multiple patch resonator type, it is also possible to use the coil as a dedicated reception coil and conduct the RF transmission by using a different external large coil.

Other objects, features and advantages of the invention will become apparent from the following description of the embodiments of the invention taken in conjunction with the accompanying drawings.

DESCRIPTION OF THE EMBODIMENTS

Hereafter, embodiments of the present invention will be described with reference to the drawings.

Figure 1:
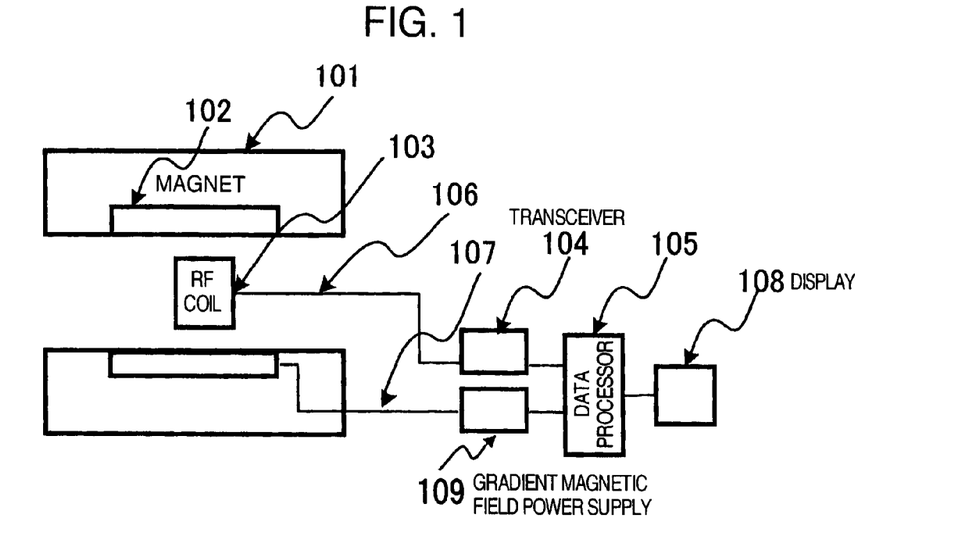
FIG. 1 is a configuration diagram showing an outline of an MRI apparatus to which the present invention is to be applied.

FIG. 1 is a diagram showing an outline of an MRI apparatus to which the present invention is to be applied.

The MRI apparatus includes a magnet 101 for applying a static magnetic field to a subject, a gradient magnetic field coil 102 for supplying a magnetic field gradient in a predetermined direction to the static magnetic field, an RF coil 103 inserted in the magnet 101 to transmit an electromagnetic wave such as a radio wave to the subject and receive an electromagnetic wave from the subject, a transceiver 104 connected to the RF coil 103 to generate and transmit the electromagnetic wave emitted from the RF coil, detect a nuclear magnetic resonance signal supplied from the RF coil, and conduct signal processing, a gradient magnetic field power supply 109 for supplying a current to the gradient magnetic field coil 102, a data processor 105 for controlling drive of the transceiver 104 and the gradient magnetic field power supply 109, conducting various kinds of information processing, and conducting operation according to the operator's command, and a display 108 for displaying a result of processing conducted by the data processor 105.

The gradient magnetic field power supply 109 is coupled to the gradient magnetic field coil 102 via a gradient magnetic field control cable 107. The RF coil 103 is coupled to the transceiver 104 via a coil controlling cable & transceiver cable 106. The RF coil 103 includes a plurality of subcoils, and transmission and reception changeover and channel changeover are conducted according to a control signal. The control signal is sent from a controller included in the transceiver 104 or the data processor 105, or from an independently provided controller. Either a transceiver corresponding to multi-channel transmission/one-channel reception or a transceiver corresponding to one-channel transmission/multi-channel reception is mounted on the transceiver 104.

In the MRI apparatus having such a configuration, a subject (not illustrated) disposed in the static magnetic field is irradiated with an electromagnetic wave interrupted at intervals of approximately several milliseconds and a gradient magnetic field by the RF coil 103 and the gradient magnetic field coil 102. The MRI apparatus receives a signal emitted from the subject in resonance to the electromagnetic wave, conducts signal processing, and acquires a magnetic resonance image. Although the single RF coil 103 is shown in FIG. 1, a plurality of RF coils such as an RF coil for wide range imaging and an RF coil for a local region are used in some cases.

Figure 2:
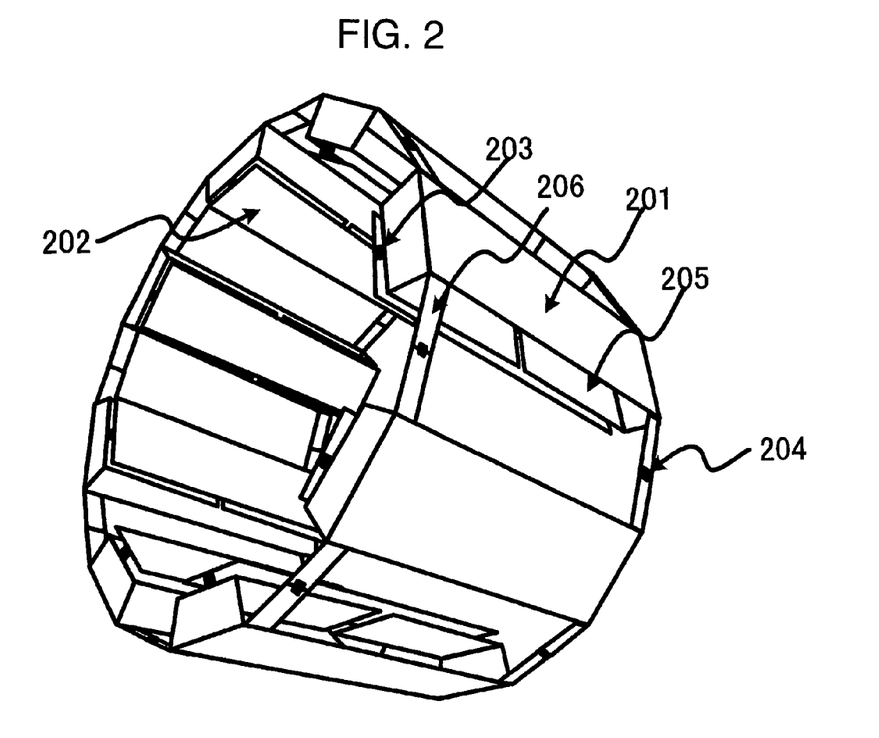
FIG. 2 is a diagram showing an embodiment of an RF coil according to the present invention.

A coil apparatus according to the present invention is applied to the RF coil 103 in such an MRI apparatus. FIG. 2 shows a general diagram in the case where the RF coil apparatus is applied to an MRI head coil as an embodiment of the coil apparatus according to the present invention.

The RF coil according to the present embodiment has a structure obtained by disposing a plurality of (in the illustrated example, eight) subcoils 200 each formed of a first conductor part 201 and a second conductor part 202, so as to form a cylinder with the second conductor parts 202 disposed inside and the first conductor parts 201 disposed outside. If the RF coil is used as a coil for head, a head of a human body is inserted into the cylinder to conduct MRI imaging. The coil size is not restricted.

In the case of a head coil, however, for example, the outside diameter of the whole is approximately 340 mm, the inside diameter is approximately 270 mm, and the length in the axial direction is approximately 220 mm. In this coil, there are a multi-channel mode having a channel every subcoil and having sensitivity distribution, and a one-channel mode having one wide sensitivity distribution as the whole coil.

Figure 3:
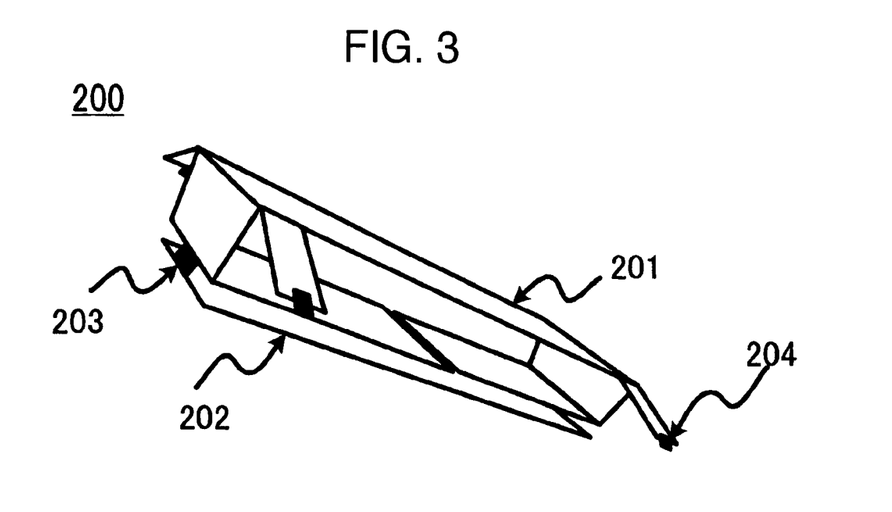
FIG. 3 is a diagram showing a configuration of a subcoil included in the RF coil shown in FIG. 2.

One of subcoils included in the RF coil is shown in FIG. 3. Each of the first conductor part 201 and the second conductor part 202 is formed of a thin conductive metal sheet, specifically a copper foil of approximately several tens μm. If the RF coil is a coil for MRI apparatus, all components forming the coil are made of nonmagnetic materials. As a result, the components can be prevented from generating image noise or distortion. As for the coil shape, the second conductor part 202 disposed inside, i.e., disposed on a side closer to the internal subject is formed of a rectangular sheet as illustrated. The first conductor part 201 disposed on the outer side includes a folded part 205 formed by folding a sheet in a box form and an arm part 206 for connection to a first conductor part of another adjacent subcoil. The first conductor part 201 and the conductor part 202 are supported by a supporter formed of nonmagnetic engineering plastics such as Delrin® or acrylyl.

The first conductor part 201 and the second conductor part 202 are electrically connected to each other via an inter-conductor capacitor 203. According to the use form of the coil apparatus according to the present embodiment, a transmission circuit, a reception circuit and a changeover switch circuit for them are connected to the inter-conductor capacitor 203 in parallel to the first conductor part 201 and the second conductor part 202. The transmission circuit, the reception circuit and the changeover switch circuit form first conduction control means for controlling conduction between the first conductor part 201 and the second conductor part 202. Although described later, a capacitance changeover type capacitor may also be used instead of the inter-conductor capacitor 203.

As for the first conductor parts 201 arranged on the outer periphery of the cylinder, the arm parts 206 of adjacent first conductor parts 201 are connected via an inter-subcoil conduction control circuit 204. The inter-subcoil conduction control circuit 204 forms second conduction control means for changing over between the multi-channel mode and the one-channel mode especially when the coil apparatus according to the present embodiment is used in a circuit configuration of one-channel transmission/multi-channel reception. Details of the inter-subcoil conduction control circuit 204 will be described later.

Based upon the above-described configuration, the RF coil according to the present embodiment is combined with a multi-channel transmission/one-channel reception transceiver or a one-channel transmission/multi-channel reception transceiver to implement a one-channel mode having a function such as that of a multiple patch resonator type coil and a multi-channel mode having a function such as that of a microstrip line type coil.

Hereafter, a circuit configuration used when connecting the RF coil shown in FIG. 2 will be described. First, a configuration of the multi-channel transmission/one-channel reception will now be described.

Figure 4:
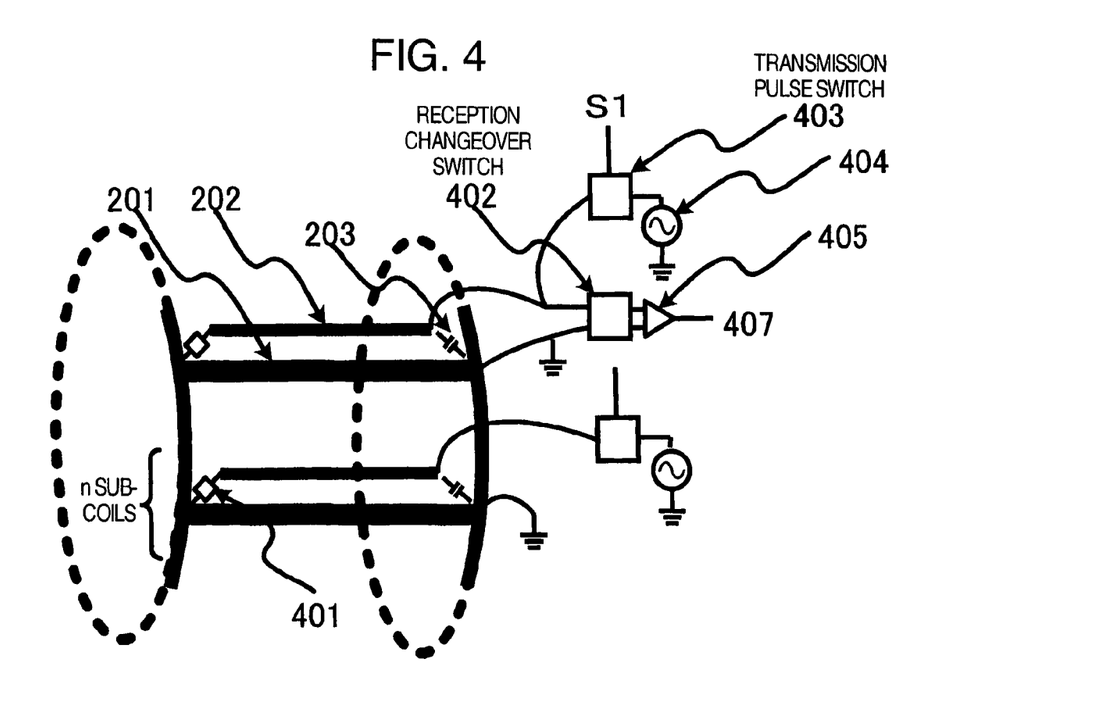
FIG. 4 is a circuit configuration diagram of multi-channel transmission/one-channel reception using an RF coil according to the present invention.

FIG. 4 shows a circuit configuration used when using the RF coil shown in FIG. 2 for the multi-channel transmission/one-channel reception. In FIG. 4, the first conductor part 201 and the second conductor part 202 are represented schematically by black thick lines. As for the subcoils each including the first conductor part 201 and the second conductor part 202, only two sets are depicted in FIG. 4 for the purpose of omission. As shown in FIG. 2, however, a plurality of subcoils are arranged on the circumference. In this embodiment, adjacent first conductors 201 are connected to each other via a conductor. Instead of connecting them via the conductor, the adjacent first conductors 201 may be electrically connected to each other via the inter-subcoil conduction control circuit 204.

Only one subcoil (a subcoil shown on the upper part of FIG. 4) among the subcoils is connected to a received signal connector 407. Every subcoil is connected to a transmission source 404. The transmission source 404 is connected to the inter-conductor capacitor 203 of the subcoil via a transmission pulse switch 403.

It is desirable that the transmission source 404 has low connection impedance. According to a simulation result of the coil operation, it can be confirmed that the coil can operate as a multi-channel transmission coil even with typically used 50-ohm impedance. However, it is indicated that the Q value which indicates the sharpness of resonance becomes low. For efficient RF irradiation, therefore, it is desirable that the connection impedance of the transmission source 404 is approximately several ohms.

The transmission pulse switch 403 is turned on and off by a control signal S1 supplied from a controller which is not illustrated or the transceiver 104 via the coil control cable 106. Input power in the range of several milliwatts to even several kilowatts passes through the transmission pulse switch 403 according to the coil kind and use object. Therefore, it is necessary to suitably select circuit elements according to the use power. At the time of reception, the transmission pulse switch 403 also functions to prevent a received signal of several milliwatts or less from being inversely input to a transmission circuit part.

Figure 5:
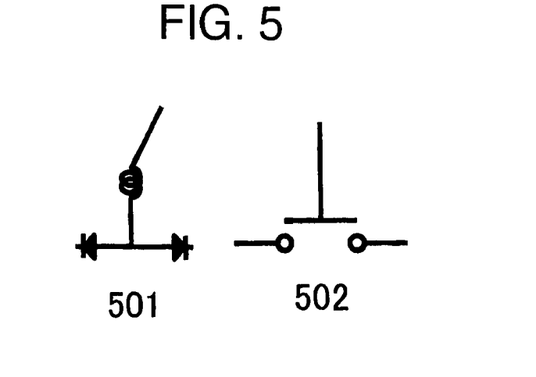
FIG. 5 is a diagram showing a concrete example of a transmission pulse switch.

A circuit configuration example of the transmission pulse switch 403 is shown in FIG. 5. The illustrated example is a typical transmission pulse switch 501 which includes two diodes and which is supplied with the transmission control signal S1 (reception portion) via an inductor. In this transmission pulse switch 501, a positive voltage is applied to the diodes to obtain conduction between left and right ends of the circuit 501 according to the control signal at the time of transmission. At the time of reception, a reverse voltage is applied to each diode to insulate the left and right ends of the circuit 501. This circuit can be replaced by a mechanical switching circuit 502 using a technique such as the MEMS (Micro Electro Mechanical System).

On the other hand, the received signal connector 407 is connected to the capacitor 203 of the subcoil via a preamplifier 405 and a reception changeover switch 402. A switch used as the reception changeover switch 402 is also turned on and off according to a control signal supplied from the above-described controller or passively changed over according to voltage strength input to the switch 402.

Figure 6:
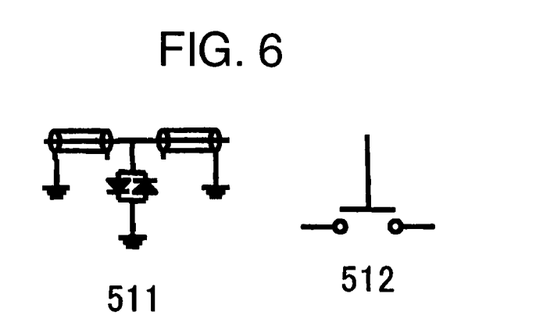
FIG. 6 is a diagram showing a concrete example of a reception changeover switch.

FIG. 6 shows a detailed circuit configuration example of the reception changeover switch 402. A circuit 511 includes two quarter-wavelength coaxial cables and antiparallel connected diodes. It is known that the quarter-wavelength coaxial cable causes total reflection and assumes high impedance of at least several kilo-ohms when the terminal is short-circuited, whereas the quarter-wavelength coaxial cable assumes low impedance when the terminal is opened. Because of the property of the diode, the antiparallel connected diodes is short-circuited when a voltage of at least several volts is applied across them and equivalently opened when a voltage of several millivolts or less is applied. For the transmission pulse, the antiparallel connected diodes is short-circuited because the transmission pulse has a high voltage. For the received voltage, the antiparallel connected diodes is opened because the received voltage is several tens millivolts or less. The circuit 511 is an example of the passive switch described earlier.

When the transmission pulse is input to the circuit 511 from its left end, total reflection is caused in the circuit and the transmission signal does not arrive at the right end of the circuit. In contrast, when the received signal is input from the left end of the circuit, the circuit becomes equivalent to a coaxial cable having a half wavelength and the signal arrives at the right end with little loss. The circuit 511 can be replaced by a mechanical switch circuit 512 using the MEMS in the same way as the circuit 502. The switch circuit 512 is an example of a switch that requires a control signal.

A capacitance changeover capacitor circuit 401 is inserted between the first conductor 201 and the second conductor 202. The capacitance changeover capacitor circuit 401 is paired with the inter-conductor capacitor 203, and inserted to adjust the resonance peak of the subcoil. In other words, the capacitance changeover capacitor circuit 401 is adjusted, and the electric capacitance at the time of reception is made different from that at the time of transmission. As a result, the coil configuration can cope with both the one-channel mode and the multi-channel mode.

Figure 7:
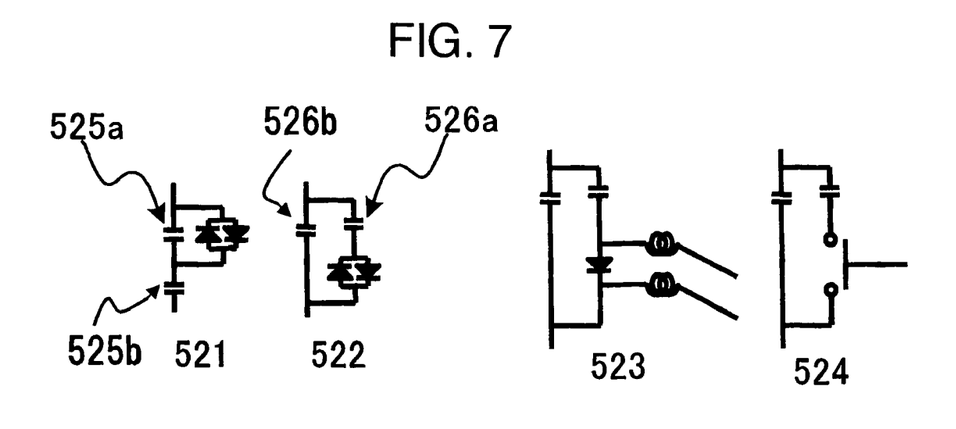
FIG. 7 is a diagram showing a concrete example of a capacitance changeover capacitor circuit.

A detailed circuit configuration example of the capacitance changeover capacitor circuit 401 is shown in FIG. 7. Circuits 521 and 522 shown in FIG. 7 are examples using antiparallel connected diodes. In the circuit 521, antiparallel connected diodes are connected in parallel to one of two capacitors 525a and 525b connected in series. It is supposed that the capacitor 525a connected in parallel to the antiparallel connected diodes has capacitance C1 and the capacitor 525b has capacitance C2. If a high voltage is applied, the circuit 521 has capacitance C2. If a low voltage is applied, the circuit 521 has capacitance C1*C2/(C1+C2). Therefore, the capacitance is low when the voltage is low. In the circuit 522, antiparallel connected diodes are connected in series with one of two capacitors 526a and 526b connected in parallel. It is supposed that the capacitor 526a connected in series with the antiparallel connected diodes has capacitance C1 and the capacitor 526b has capacitance C2. If a high voltage is applied, the circuit 522 has capacitance C1+C2. If a low voltage is applied, the circuit 522 has capacitance C2. In this case as well, the capacitance is low when the voltage is low. Therefore, it is appreciated that it is difficult to form a circuit that has large capacitance when the voltage is low.

A circuit 523 is a circuit in the case where the capacitor capacitance is changed over by conducting constant current control on the diode connected to the capacitor in series. When a positive voltage is applied to the diode, the capacitor connected in series with the diode functions. When a reverse voltage is applied, the capacitor connected in series with the diode does not function and the capacitor becomes as if it is insulated. In a circuit 524, the diode which conducts changeover in the circuit 523 is replaced by a mechanical switching circuit using a technique such as the MEMS.

The above-described capacitance changeover capacitor circuit 401, the reception changeover switch 402, the transmission pulse switch 403 and the reception preamplifier 405 function with the inter-conductor capacitor 203 as first conduction control means which changes over the conduction state between the first conductor part 201 and the second conductor part 202 according to whether the operation is transmission or reception.

Operation of the above-described circuit configuration will now be described. First, at the time of transmission, the reception changeover switch 402 is turned off, and the transmission pulse switch 403 is turned on by the transmission control signal S1. In this case, the capacitance changeover capacitor circuit 401 is changed over to electric capacitance with which the subcoil is tuned to the frequency of a signal to be transmitted. As a result, a current from the transmission source 404 is let flow through the subcoil and RF-transmitted. At the time of reception operation, the reception changeover switch 402 is turned on and the transmission pulse switch 403 is turned off. At this time, the capacitance changeover capacitor circuit 401 is changed over to electric capacitance at which a resonance frequency of one coil obtained by combining the subcoils is tuned to the frequency of a signal to be received. For example, the resonance frequency of the coil is tuned to the resonance frequency of hydrogen atomic nuclei in the MRI apparatus. As a result, the received signal detected by the coil is amplified by the reception preamplifier 405 and sent to a receiver via the received signal connector 407.

The multi-channel transmission/one-channel reception is implemented by thus changing over the on/off states of the reception changeover switch 402 and the transmission pulse switch 403 and changing over the electric capacitance of the capacitance changeover capacitor circuit 401 according to whether to conduct transmission or reception. In other words, it is possible to obtain effects similar to those obtained when transmission is conducted by using the microstrip line type coil and reception is conducted by using the multiple patch resonator type coil. In addition, only one reception channel is needed and the apparatus configuration can also be simplified.

A configuration of one-channel transmission/multi-channel reception will now be described.

Figure 8:
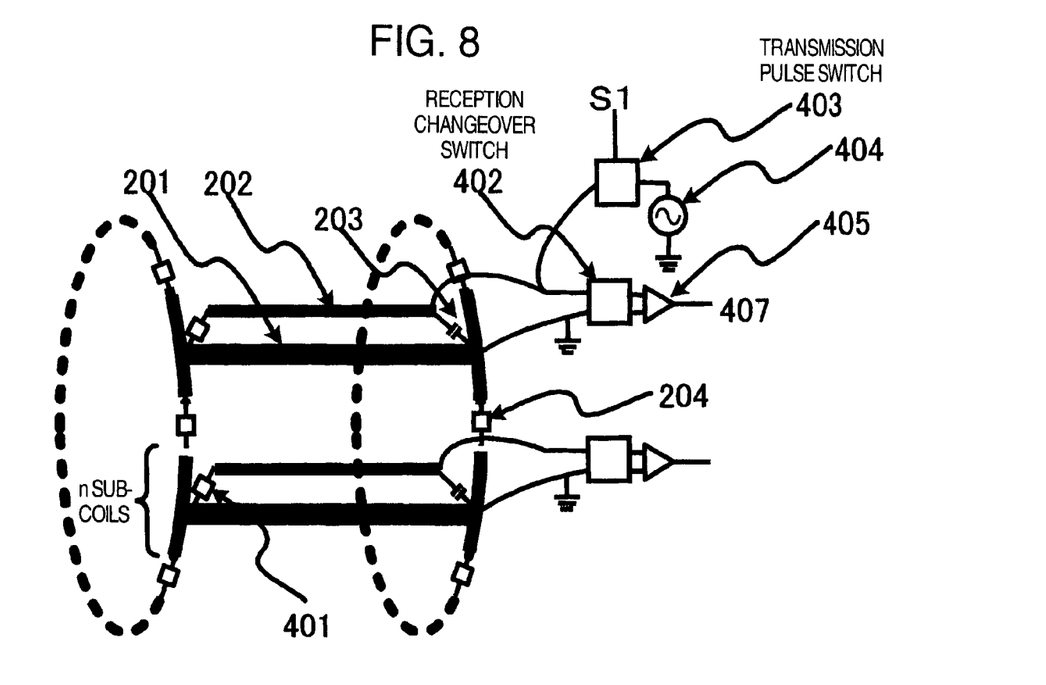
FIG. 8 is a circuit configuration diagram of one-channel transmission/multi-channel reception using an RF coil according to the present invention.

FIG. 8 shows a circuit configuration example in the case where the RF coil shown in FIG. 2 is formed as a one-channel transmission/multi-channel reception circuit. The first conductor 201 and the second conductor 202 are connected to each other via the inter-conductor capacitor 203 and the capacitance changeover capacitor circuit 401 in the same way as the multi-channel transmission/one-channel reception circuit shown in FIG. 4. In this case, the first conductors 201 in adjacent subcoils are connected via the inter-subcoil conduction control circuits 204. Although a concrete circuit of the inter-subcoil conduction control circuit 204 will be described later, it short-circuits subcoils (first conductors) at the time of transmission and functions as an insulating circuit at the time of reception. The reception changeover switch 402 is connected in parallel to the inter-conductor capacitor 203 of every subcoil. The transmission pulse switch 403 is connected to only one subcoil.

In the same way as the case of the multi-channel transmission/one-channel reception shown in FIG. 4, the transmission control signal S1 is input to the transmission pulse switch 403 to control the output of the transmission source 404 and the reception changeover switch 402 is connected to the low-impedance preamplifier 405 to convey the received signal to the receiver via the reception preamplifier 405 and the received signal connector 407. In this configuration as well, it is desirable that the input impedance of the reception preamplifier 405 is low impedance, and specifically 2 ohms or less is desirable. When the subcoils function as multi-channel reception coils, the first conductor part 201 and the second conductor part 202 are connected to each other via the low-impedance preamplifier 405. If this part has low impedance, the Q value becomes large and the reception sensitivity is improved, partly owing to the effect that coupling between subcoils decreases.

At the time of transmission in such a configuration, the reception changeover switch 402 in each subcoil is turned off, and the transmission pulse switch 403 is turned on in response to the transmission control signal S1. The capacitance changeover capacitor circuit 401 is changed over to electric capacitance with which one coil obtained by combining a plurality of subcoils is tuned to the frequency of a signal to be transmitted. As a result, a current from the transmission source 404 of one channel is let flow through the whole coil and RF-transmitted. At the time of reception operation, the reception changeover switch 402 is turned on and the transmission pulse switch 403 is turned off. At this time, the capacitance changeover capacitor circuit 401 is changed over to electric capacitance at which a resonance frequency of each subcoil is tuned to the frequency of a signal to be received. The received signal detected by each subcoil is amplified by the reception preamplifier 405 and sent to a receiver via the received signal connector 407.

In this way, the capacitance changeover capacitor circuit 401 is changed over so as to become different in capacitance according to whether to conduct transmission or reception. Its concrete circuit configuration is shown in FIG. 7. It is easier to produce a capacitance changeover capacitor circuit 401 having capacitance at the time of transmission larger than that at the time of reception. In general, when inter-subcoil insulation has been conducted, the resonance frequency of each subcoil single substance falls. If the capacitance of the capacitance changeover capacitor circuit 401 is made small, the resonance frequency rises. For using the coil according to the present embodiment to conduct the one-channel transmission/multi-channel reception, therefore, it becomes necessary to provide the inter-subcoil conduction control circuit 204 which conducts short-circuiting between subcoils (between first conductors) at the time of transmission and conducts insulation between them at the time of reception in response to these changes in resonance frequency.

Figure 9:
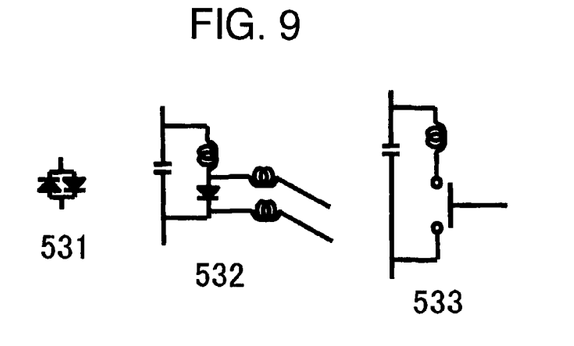
FIG. 9 is a diagram showing a concrete example of an inter-subcoil conduction control circuit.

FIG. 9 shows a detailed circuit configuration example of the inter-subcoil conduction control circuit 204. A circuit 531 shows a case where the inter-subcoil conduction control circuit 204 is simply formed of antiparallel connected diodes. The subcoils (the first conductors) are short-circuited to each other at the time of transmission and insulated from each other at the time of reception. A circuit 532 is a conduction control circuit using an LC (inductor and capacitor) resonance circuit. Previously, values of the inductor and capacitor are set so as to make the frequency of parallel resonance equal to a frequency to be used. The value of the capacitor is set equal to a value as large as several hundreds picofarads so as to apparently become low in impedance at high frequencies of at least several tens MHz. When it is desired to make the circuit 532 conductive, a reverse voltage is applied to the diode to insulate the inductor part. As for the whole circuit, conduction at low impedance is obtained via the capacitor. On the contrary, when it is desired to conduct insulation as for the whole circuit, a positive voltage is applied to the diode to cause the LC parallel resonance circuit to function and have high impedance against conduction. A circuit 533 is obtained by replacing the switch function of the diode in the circuit 532 with a mechanical switch such as the MEMS.

The one-channel transmission/multi-channel reception is implemented by thus changing over the on/off states of the reception changeover switch 402, the transmission pulse switch 403 and the inter-subcoil conduction control circuit 204 and changing over the electric capacitance of the capacitance changeover capacitor circuit 401 according to whether to conduct transmission or reception. In other words, it is possible to obtain effects similar to those obtained when transmission is conducted by using the multiple patch resonator type coil and reception is conducted by using the microstrip line type coil. In addition, only one transmission channel is needed and it is not necessary to prepare and install separate coils for transmission and reception. As a result, the apparatus configuration can also be simplified.

Figure 10:
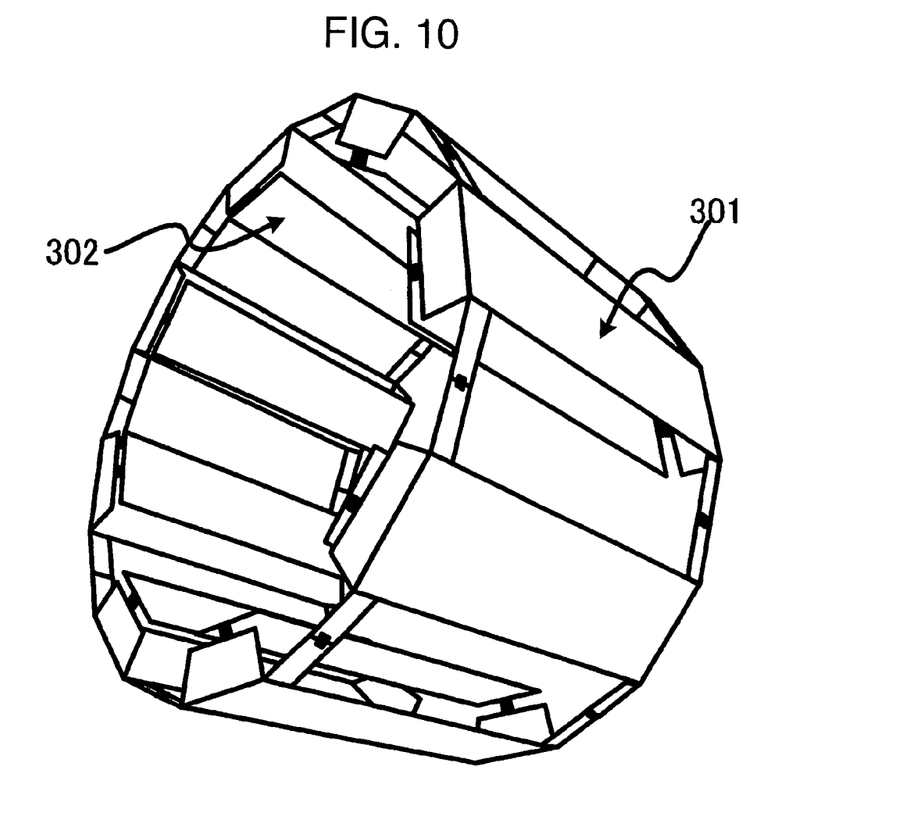
FIG. 10 is a diagram showing another embodiment of the RF coil according to the present invention.
Figure 11:
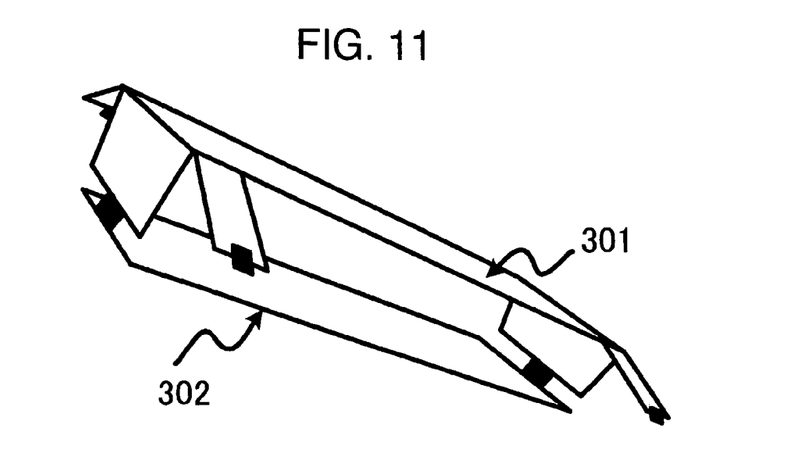
FIG. 11 is a diagram showing a configuration of a subcoil included in the RF coil shown in FIG. 10.

Heretofore, the embodiment of the coil apparatus according to the present invention has been described. As for the shape of the coil apparatus according to the present invention and switch elements included in the coil apparatus, various changes can be made. For example, although the cylindrical coil apparatus is shown in FIG. 2, the coil apparatus may be transformed according to the shape of the test subject. In the coil apparatus described with reference to FIG. 2, the first conductor part 201 has the folded part 205 folded back to the second conductor part side. However, the coil can be formed without the folded part 205. FIGS. 10 and 11 show a general diagram and a subcoil of an RF coil that does not have the folded part 205. In this embodiment as well, the subcoil includes a first conductor part 301 and a second conductor part 302. The second conductor part 302 is formed of a rectangular sheet. The first conductor part 301 has an arm part for connection to the first conductor part in another adjacent subcoil. Other configurations are the same as those in the embodiment shown in FIG. 2.

The RF coil shown in FIG. 10 does not have the folded part 205 and the inductance quantity formed by the coil conductor part is reduced. As a result, the RF coil shown in FIG. 10 is suitable as a coil for an MRI apparatus having a higher magnetic field.

In the embodiment heretofore described, the case where the coil apparatus according to the present invention is used as a coil for both transmission and reception has been described. However, the present invention incorporates the case where the coil apparatus is used as a dedicated reception coil or a dedicated transmission coil.

As heretofore described, the present invention provides a coil apparatus that is large in the degree of freedom in design and that can implement the microstrip line type coil and the multiple patch resonator type coil by using one coil, when using the high magnetic field MRI apparatus. According to the present invention, one RF coil can be used for one-channel transmission/multi-channel reception or multi-channel transmission/one-channel reception. By providing such an RF coil, the MRI apparatus according to the present invention can implement the parallel transmission and the parallel imaging with as a few number of channels as possible. In addition, when operated as a one-channel reception coil of multiple patch resonator type, the coil apparatus according to the present invention has a form allowing intrusion of an external RF electromagnetic field. Therefore, it is also possible to use the coil apparatus according to the present invention as a multiple patch resonator type coil dedicated for reception by conducting the RF transmission with a different large external coil.

EXAMPLES

Hereafter, examples of the case where an RF coil has a shape including eight subcoils as shown in FIG. 2 is applied to the multi-channel transmission/one-channel reception and the one-channel transmission/multi-channel reception will be described. Coil design in the examples described hereafter is based upon results obtained by conducting simulation on an RF coil having a length in the axial direction of approximately 220 mm, an outside diameter of approximately 340 mm, and an inside diameter of approximately 270 mm.

First Example

Figure 12:
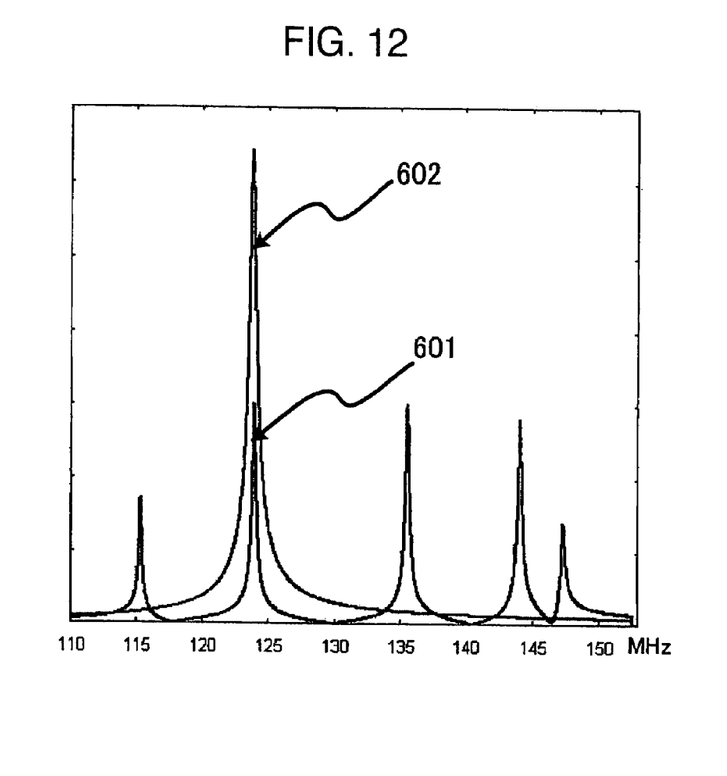
FIG. 12 is a diagram showing graphs of resonance impedance characteristics in a multi-channel mode and a one-channel mode of an RF coil according to the present invention.

First, resonance characteristics of an RF coil having a shape including eight subcoils are found by simulation. Results are shown in FIG. 12. In FIG. 12, the abscissa indicates the frequency and the ordinate indicates resonance impedance. As indicated by a graph 601, a plurality of peaks appear in resonance characteristics in the one-channel mode. There is a property that the number of peaks becomes equal to (the number of subcoils/2+1). In the RF coil including eight subcoils, the number of peaks becomes five. At a resonance peak having a second lowest frequency among five peaks arranged on a frequency axis, the sensitivity is obtained most uniformly within the coil cylinder. In the coil design, therefore, it is necessary to determine the capacitance of the capacitor 203 between conductors and the capacitance of the capacitance changeover capacitor 401 so as to make both the resonance peak 602 in the multi-channel mode and the second resonance peak in the one-channel mode equal to the resonance frequency of the nuclear spin of the test subject.

Therefore, the resonance peak in the multi-channel mode and the second resonance peak in the one-channel mode are set near 126 MHz which is the resonance frequency of hydrogen nuclei in the MRI apparatus of 3 Tesla. In that case, the capacitance of the inter-conductor capacitor 203 in the RF coil of the multi-channel transmission and one-channel reception shown in FIG. 4 and the capacitance of the capacitance changeover capacitor 401 are found by simulation. As a result, it is appreciated to be suffice that the capacitance of the inter-conductor capacitor 203 is 25 pF, and the capacitance of the capacitance changeover capacitor circuit 401 is 38 pF at the time of the multi-channel transmission and 25 pF at the time of one-channel reception. Therefore, for example, it suffices that the circuit 522 shown in FIG. 7 is used as the capacitance changeover capacitor circuit 401, the capacitor 526a has capacitance of 13 pF, and the other capacitor 526b has capacitance of 25 pF.

Under this condition, the resonance impedance characteristics become the graph 602 having a single peak as shown in FIG. 12 in each channel at the time of the multi-channel transmission, and become the graph 601 having a plurality of peaks at the time of reception.

Figure 13A:
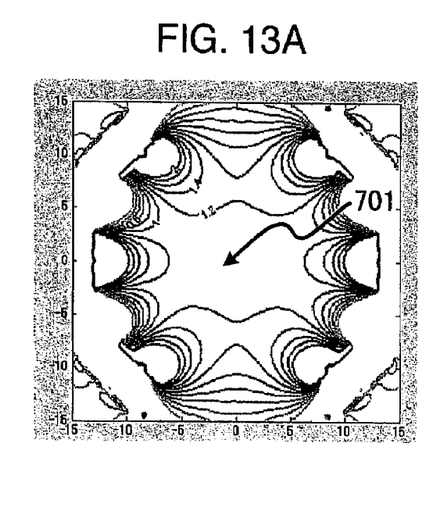
FIGS. 13A and 13B are diagrams showing sensitivity maps in a multi-channel mode and a one-channel mode of an RF coil according to the present invention.
Figure 13B:
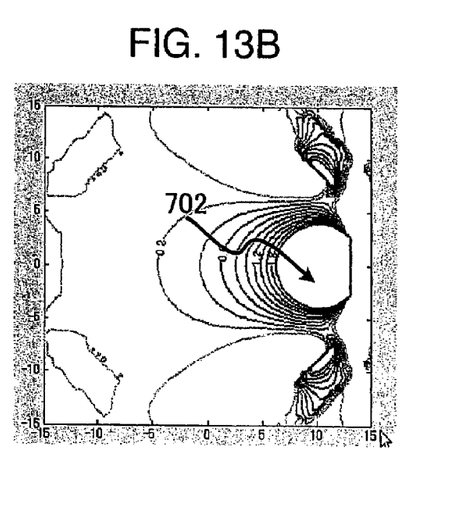

Simulation results of a sensitivity map at a section perpendicular to a central axis in the axial direction of a cylindrical axis of this coil are shown in FIGS. 13A and 13B. FIG. 13A corresponds to the one-channel mode, and FIG. 13B corresponds to the multi-channel mode. At the time of the multi-channel transmission, the sensitivity is locally present in a region adjacent to each of the eight subcoils as shown in FIG. 13B, and a contour-line map 702 as shown in FIG. 13B is formed. The unit of the contour line in the sensitivity map is $A/(m\sqrt{W})$. In FIG. 13B, only the sensitivity obtained by using only the rightmost coil among the eight subcoils is shown. The sensitivity of the RF coil becomes the sum of sensitivities of the eight subcoils. The sensitivity of the RF coil corresponds to a result obtained by rotating and arranging the map 702 around the cylinder of the RF coil and superposing eight resultant maps. On the other hand, the sensitivity map at the time of the one-channel reception becomes as represented by 701. It is appreciated that the sensitivity is present nearly uniformly in the coil.

Second Example

In the one-channel transmission/multi-channel reception RF coil shown in FIG. 8, the resonance peak in the multi-channel mode and the second resonance peak in the one-channel mode shown in FIG. 12 are set nearly equal to 126 MHz which is the resonance frequency of hydrogen nuclei in the MRI apparatus of 3 Tesla. In this case, the capacitance of the inter-conductor capacitor 203 and the capacitance of the capacitance changeover capacitor 401 are found by simulation. In the one-channel transmission/multi-channel reception RF coil, the inter-subcoil conduction control circuit 204 is added between the first conductors unlike the multi-channel transmission/one-channel reception RF coil.

Since the conduction between subcoils is limited by the inter-subcoil conduction control circuit 204, the resonance peak in the case of the multi-channel mode (the case of the single peak 602) shifts to the low frequency side. As a result, it becomes possible in the second example as well to use the circuit 521 and the circuit 522 shown in FIG. 7 as the capacitance changeover circuit 401.

As a result of simulation, it is appreciated to be suffice that the capacitance of the inter-conductor capacitor 203 is 25 pF, and the capacitance of the capacitance changeover capacitor circuit 401 is 25 pF at the time of the one-channel transmission and 22 pF at the time of reception. Therefore, for example, it suffices that the circuit 521 shown in FIG. 7 is used as the capacitance changeover capacitor circuit 401, the capacitor 525a has capacitance of 183 pF, and the other capacitor 525b has capacitance of 25 pF. By the way, it is possible to use the circuit 522 as well. In the present example, capacitor capacitances changed over are 25 pF and 22 pF, resulting in a small difference. In the circuit 522, therefore, it is necessary to use a capacitor having capacitance which is as small as 3 pF, resulting in a large error. In the present example, therefore, it is better to adopt the circuit 521.

Under this condition, the resonance impedance characteristics become the graph 602 having a single peak as shown in FIG. 12 in each channel at the time of the multi-channel reception, and become the graph 601 having a plurality of peaks at the time of transmission.

In the one-channel mode, the sensitivity map becomes the sensitivity map 701 in which the sensitivity is present in the coil nearly uniformly as shown in FIGS. 13A and 13B. As a result, uniform RF transmission becomes possible. At the time of the multi-channel reception, the sensitivity map 702 having sensitivity which is locally present around a subcoil is obtained. In the coil as a whole, a sensitivity obtained by superposing eight sensitivity maps 702 around respective coils is obtained.

The coil apparatus according to the present invention can be used as one component of an MRI apparatus; besides it can be applied to all devices using an electromagnetic wave having a frequency in the range of several MHz to several GHz.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A coil apparatus used to transmit a signal to a test subject and/or receive a signal from the test subject, the coil apparatus comprising:
   a plurality of subcoils each having a first conductor part and a second conductor part disposed nearer the test subject than the first conductor part;
   coil conduction means for attaining conduction among the subcoils; and
   first conduction control means for controlling a conduction state between the first conductor part and the second conductor part,
   wherein the coil conduction means comprises a first coil conducting means for connecting first end portions of each adjacent subcoils among said plurality of subcoils and a second coil conducting means for connecting second end portions of each adjacent subcoils among said plurality of subcoils.

2. The coil apparatus according to claim 1, wherein
   the first conduction control means comprise at least one capacitor and switch means connected in parallel, and
   the first conduction control means have electric capacitance at time of transmission different from that at time of reception.

3. The coil apparatus according to claim 2, wherein the switch means comprise a switch using diodes or a micro electromechanical system.

4. The coil apparatus according to claim 1, wherein
   each of the subcoils is connected to transmission means, and
   one of the subcoils is connected to reception means.

5. The coil apparatus according to claim 1, wherein
   each of the subcoils is connected to reception means, and
   one of the subcoils is connected to transmission means.

6. The coil apparatus according to claim 1, comprising switch means for connecting the subcoils to a transmission source in transmission & reception means at time of transmission and disconnect the subcoils from the transmission source at time of reception.

7. The coil apparatus according to claim 6, wherein the switch means comprise diodes and an inductor.

8. The coil apparatus according to claim 1, comprising switch means for connecting the subcoils to a reception amplifier in transmission & reception means at time of reception and disconnect the subcoils from the reception amplifier at time of transmission.

9. The coil apparatus according to claim 8, wherein the switch means comprise a switch comprising quarter-wavelength cables and diodes, or a switch using a micro electromechanical system.

10. The coil apparatus according to claim 1, wherein the coil conduction means comprise second conduction control means for controlling a conduction state between the subcoils.

11. The coil apparatus according to claim 10, wherein the second conduction control means comprise a pair of antiparallel connected diodes connected between adjacent subcoils.

12. The coil apparatus according to claim 10, wherein
    the second conduction control means is connected between adjacent subcoils, and
    the second conduction control means comprise an inductor and a capacitor which form a resonance circuit, and switch means for opening or closing the resonance circuit.

13. The coil apparatus according to claim 12, wherein the switch means comprise a switch using a diode or a micro electromechanical system.

14. The coil apparatus according to claim 1, wherein
    the subcoils substantially form a cylinder, and
    the subcoils are disposed so as to have the first conductor part on an outside of a cylinder and the second conductor part on an inside of the cylinder.

15. The coil apparatus according to claim 14, wherein
    each of the first conductor part and the second conductor part comprises a sheet-like member, and
    the first conductor part and the second conductor part are disposed so as to be opposed to each other with a space in a radial direction of the cylinder between.

16. The coil apparatus according to claim 1, wherein subcoils disposed so as to be adjacent to each other have an electromagnetic wave transmission property between.

17. The coil apparatus according to claim 1, comprising a nonmagnetic material.

18. A magnetic resonance imaging apparatus including a static magnetic field generation system for generating a static magnetic field in a space in which a test subject is placed, a gradient magnetic field generation system for providing the static magnetic field with a magnetic field gradient, a radio frequency coil for applying a radio frequency magnetic field to the test subject and detecting a nuclear magnetic resonance signal generated from the test subject, transmission and reception means for transmitting a signal to the radio frequency coil and receiving a signal from the radio frequency coil, and a computer for conducting signal processing on the nuclear magnetic resonance signal and calculating an image and a spectrum of the test subject,
    wherein the radio frequency coil comprises a coil apparatus comprising:
    a plurality of subcoils each having a first conductor part and a second conductor part disposed nearer the test subject than the first conductor part;
    coil conduction means for attaining conduction among the subcoils; and
    first conduction control means for controlling a conduction state between the first conductor part and the second conductor part,and
    wherein the coil conduction means comprises a first coil conducting means for connecting first end portions of each adjacent subcoils among said plurality of subcoils and a second coil conducting means for connecting second end portions of each adjacent subcoils among said plurality of subcoils.

19. The magnetic resonance imaging apparatus according to claim 18, wherein the transmission and reception means comprise a plurality of transmission means and one or more reception means, and the number of the reception means is less than the number of subcoils in the radio frequency coil.

20. The magnetic resonance imaging apparatus according to claim 18, wherein the transmission and reception means comprise one or more transmission means and a plurality of reception means, and the number of the transmission means is less than the number of subcoils in the radio frequency coil.

* * * * *